(12) United States Patent
Franke

(10) Patent No.: US 12,021,419 B2
(45) Date of Patent: Jun. 25, 2024

(54) ELECTRONIC MODULE AND DRIVE

(71) Applicant: Bayerische Motoren Werke Aktiengesellschaft, Munich (DE)

(72) Inventor: Torsten Franke, Munich (DE)

(73) Assignee: Bayerische Motoren Werke Aktiengesellschaft, Munich (DE)

( * ) Notice: Subject to any disclaimer, the term of this patent is extended or adjusted under 35 U.S.C. 154(b) by 543 days.

(21) Appl. No.: 17/297,057

(22) PCT Filed: Jan. 13, 2020

(86) PCT No.: PCT/EP2020/050619
§ 371 (c)(1),
(2) Date: May 26, 2021

(87) PCT Pub. No.: WO2020/151966
PCT Pub. Date: Jul. 30, 2020

(65) Prior Publication Data
US 2021/0408874 A1    Dec. 30, 2021

(30) Foreign Application Priority Data

Jan. 22, 2019    (DE) .................... 10 2019 101 499.9

(51) Int. Cl.
*H02K 11/00* (2016.01)
*H02K 5/20* (2006.01)
(Continued)

(52) U.S. Cl.
CPC ............ *H02K 11/30* (2016.01); *H02K 5/203* (2021.01); *H05K 1/028* (2013.01); *H05K 1/14* (2013.01);
(Continued)

(58) Field of Classification Search
CPC . H02K 1/14; H02K 5/22; H02K 11/30; H02K 2211/03; H02K 5/203; H02K 7/006;
(Continued)

(56) References Cited

U.S. PATENT DOCUMENTS 7,352,103 B2 *   4/2008   Shawcross ............. H02K 5/148
                                                               310/239
2002/0121832 A1   9/2002   Lohr et al.
(Continued)

FOREIGN PATENT DOCUMENTS

CN      102165645 A    8/2011
CN      102740650 A    10/2012
(Continued)

OTHER PUBLICATIONS

International Search Report (PCT/ISA/210) issued in PCT Application No. PCT/EP2020/050619 dated Apr. 23, 2020 with English translation (eight (8) pages).
(Continued)

*Primary Examiner* — Thomas Truong
(74) *Attorney, Agent, or Firm* — Crowell & Moring LLP

(57) ABSTRACT

An electronic module includes a first supporting element, a second supporting element, and a plurality of components arranged on the first supporting element and the second supporting element. The first supporting element and the second supporting element are electrically conductively connected, and the second supporting element forms an intermediate chamber in which the first supporting element is arranged.

16 Claims, 1 Drawing Sheet

(51) Int. Cl.
  *H02K 11/30* (2016.01)
  *H05K 1/02* (2006.01)
  *H05K 1/14* (2006.01)
  *H05K 1/18* (2006.01)

(52) U.S. Cl.
  CPC ....... *H05K 1/181* (2013.01); *H05K 2201/056* (2013.01); *H05K 2201/1009* (2013.01)

(58) Field of Classification Search
  CPC .......... H02K 11/33; H05K 1/028; H05K 1/14; H05K 1/181; H05K 2201/056; H05K 2201/1009; H05K 7/14329
  See application file for complete search history.

(56) References Cited

U.S. PATENT DOCUMENTS

| | | | |
|---|---|---|---|
| 2005/0239343 A1 | 10/2005 | Kashiwazaki | |
| 2011/0212642 A1 | 9/2011 | Franke | |
| 2012/0260499 A1 | 10/2012 | Rummler | |
| 2016/0105068 A1 | 4/2016 | Bradfield | |
| 2018/0146577 A1* | 5/2018 | Ide | H05K 7/20272 |

FOREIGN PATENT DOCUMENTS

| | | |
|---|---|---|
| CN | 103875131 A | 6/2014 |
| CN | 105322721 A | 2/2016 |
| DE | 10 2004 041 169 B3 | 6/2006 |
| DE | 10 2015 109 710 A1 | 12/2016 |
| DE | 11 2015 006 489 T5 | 1/2018 |
| EP | 2 327 121 B1 | 4/2016 |
| WO | WO 2010/034405 A1 | 4/2010 |

OTHER PUBLICATIONS

German-language Written Opinion (PCT/ISA/237) issued in PCT Application No. PCT/EP2020/050619 dated Apr. 23, 2020 (seven (7) pages).

German-language Search Report issued in German Application No. 10 2019 101 499.9 dated Nov. 28, 2019 with partial English translation (12 pages).

English translation of Chinese-language Office Action issued in Chinese Application No. 202080006161.5 dated Dec. 1, 2023 (9 pages).

* cited by examiner

ELECTRONIC MODULE AND DRIVE

BACKGROUND AND SUMMARY OF THE INVENTION

The present invention relates to an electronic module, in particular to a power electronic circuit, and to a drive or a drive module.

Circuit carriers, in particular power electronic circuit carriers, are known fundamentally from the prior art. They include boards or printed circuit boards in the most varied designs. The publication EP 2 327 121 B1 discloses for example in this connection a receiving unit for a circuit carrier having a power electronic circuit carrier and a controller board or a driver board. Circuit carriers of this type are used for example in the case of electronic controllers in the automotive industry, such as for example for hybrid drives. In this case, the aforementioned circuit carrier is characterized by virtue of the fact that it comprises multiple boards on which the corresponding components are arranged. In addition to the many advantages that this arrangement offers, there is however in this case the requirement to connect the different boards to one another in an electrical manner. Generally, in turn special plug connectors, contacts and the like are required for this purpose. This increases the cost and makes the construction more complicated.

It is therefore an object of the present invention to provide an electronic module and a drive which eliminate the aforementioned disadvantages and further optimize known electronic modules, in particular circuit carriers.

In accordance with the invention, an electronic module, in particular a circuit carrier, for example for an electric or hybrid vehicle, comprises a first carrier element and a second carrier element and a multiplicity of components which are arranged on the first carrier element and the second carrier element, wherein the first carrier element and the second carrier element are connected in an electrically conductive manner, and wherein the second carrier element forms an intermediate space in which the first carrier element is arranged or positioned. Carrier elements are in particular carriers for electronic or electrical components/component parts, in particular printed circuit boards or boards. In this case, the second carrier element is advantageously configured or formed in such a manner that it creates or forms the intermediate space or an arrangement space in which the first carrier element is arranged or positioned at least in regions or in part. In other words, the second carrier element encompasses the first carrier element at least in regions. By virtue of the fact that the second carrier element encompasses the first carrier element or the second carrier element is arranged around the first carrier element at least in regions or also completely, it is possible to realize an electronic module with an extremely compact construction which requires only very few component parts.

In accordance with a preferred embodiment, the second carrier element is embodied at least in regions in a malleable manner or at least in regions in a flexible manner and is formed in such a manner that the intermediate space is created. In particular, the second carrier element is a flexible printed circuit board that is in particular preferably an in part flexible printed circuit board. This renders it possible in particular that the aforementioned electrical contact between the first carrier element and the second carrier element is produced during the procedure of forming or folding or creasing the second carrier element. The aforementioned flexibility can be of a permanent or temporally limited nature.

In accordance with a preferred embodiment, the carrier element is U-shaped. In an expedient manner, the second carrier element comprises for example two flexible regions, by means of which the second carrier element can be brought into the U-shape, in particular by means of a corresponding folding or creasing procedure along the flexible regions. In an expedient manner, the electrical contact to the first carrier element is produced implicitly in this case. In accordance with a preferred embodiment, contact pins such as for example press-fit contact pins are provided as means for producing the electrical contact. The electrical contact is advantageously performed in a positive-locking and non-positive locking manner.

As an alternative thereto, the second carrier element as such is already produced in such a manner that it forms the intermediate space or the arrangement space. Accordingly, the first carrier element is then pushed for example into the intermediate space or arrangement space. Depending upon the position of the electrical contact, in particular of the contact pins, it is also possible in this case implicitly to realize an electrical contact.

In accordance with a preferred embodiment, the second carrier element comprises two main segments that are spaced apart from one another in a parallel manner and a connecting segment that connects the main segments, and wherein the first carrier element is arranged or positioned between the main segments. The two main segments that are spaced apart from one another and the connecting segment advantageously form the aforementioned U-shape. In this case, the connecting segment is perpendicular or essentially perpendicular to the main segments and consequently also perpendicular or essentially perpendicular to the first carrier element. In particular, the connecting segment is arranged on the end side with respect to the carrier element.

In an expedient manner, the main segments and/or the connecting segment are connected to the first carrier element in an electrical manner. The main segment and the connecting segment are advantageously connected to the carrier element in an electrical manner. In an expedient manner, electrical contact elements such as for example contact pins are arranged or provided both between the main segment or main segments and the first carrier element and also between the connecting segment and the first carrier element. In an expedient manner, the second carrier element is also used completely as a circuit carrier, in particular also on the end side, i.e., on the connecting segment. The aforementioned contact elements are arranged accordingly both on the end side on the first carrier element and also perpendicular thereto. All connections between the components which are arranged on the second carrier element are arranged directly on the second carrier element with the result that no further plug connectors or the like are required. It is understood that all lines, conductor tracks, contacts etc. are also embodied over the aforementioned flexible regions.

The second carrier element advantageously comprises a multiplicity of segments, for example also more than three, for example 4, which are oriented with respect to one another in such a manner that the or an intermediate space/arrangement space is created or formed for the first carrier element.

In accordance with a preferred embodiment, the first carrier element comprises a cooling facility, wherein components that are to be cooled are preferably arranged on the first carrier element. As a consequence, it is advantageously possible to realize a very effective cooling in particular of those components which actually require to be cooled. A cooling surface area is so to speak not "sacrificed".

In accordance with a preferred embodiment, the first carrier element comprises power electronic components, wherein the second carrier element comprises logic and/or control components. Logic and/or control components of this type do not require to be cooled. As a result, this configuration not only renders it possible to realize a very compact construction but rather also it is possible to effectively cool the relevant components.

In accordance with one embodiment, the first carrier element is more rigid than the second carrier element. In accordance with one embodiment, the first carrier element comprises an additional reinforcement, for example a suitable plate, wherein the plate comprises for example on the upper and lower face the components, in particular the components that are to be cooled, and in an expedient manner the plate comprises a cooling facility. It should be mentioned at this point that it is also possible to arrange the components on one side and/or on both sides on the second carrier element.

In accordance with one embodiment, the electronic module comprises a carrier structure that is configured so as to provide a mechanical connection between the first carrier element and the second carrier element. In a particularly advantageous embodiment, the carrier structure is for example fixedly connected to the first carrier element.

It fundamentally applies that the carrier structure can be fixedly connected to the first carrier element and/or to the second carrier element.

In an expedient manner, the carrier structure comprises fastening means that render possible a positive-locking and/or non-positive locking, preferably also releasable, arrangement and fastening of the second and/or of the first carrier element. The carrier structure advantageously comprises latching facilities for a press-in or snap-in assembly of the respective other carrier element, in particular preferably preferred of the second carrier element.

In accordance with one embodiment, the carrier structure is configured so as to create a frame for an electrically insulating casting material, preferably over the components that are to be cooled. In accordance with one embodiment, the carrier structure is embodied from synthetic material.

In accordance with a particularly preferred embodiment, the first carrier element comprises means for providing the electrical contact. These means are in particular provided so as to contact another component part in an electrical manner and in particular in a positive-locking and non-positive locking manner. It is preferred to provide an insert-push contact so as to provide the connection. In this case, it is particularly of advantage that the first carrier element is embodied in a more rigid manner than the second carrier element. In accordance with a preferred embodiment, the means for providing the electrical contact comprise conductor tracks, a positive and a negative electrical connection terminal, phase connections etc. The second carrier element also can comprise means for providing the electrical contact or for signal transmission.

The first carrier element advantageously comprises at least one connection element for supplying and/or discharging a cooling medium or a cooling fluid.

The electronic module in accordance with the invention renders possible improved configuration possibilities for the design of the logic circuit. Connecting elements such as a cable harness, and plug connectors between individual carrier elements or circuit carriers are not required since the second carrier element creates one unit. The production procedure of the power electronic part or of the power electronic circuit, cf. the first carrier element, is simplified. The end-side segment or the connecting element of the second carrier element assumes the connecting function between the two parallel (main) segments. The entire second carrier element is available for the logic circuit, also the end-side connecting segment.

The invention also relates to a drive or a drive module, for example a hybrid or electric drive of a motor vehicle, comprising a traction motor and at least one electronic module in accordance with the invention, in particular as a control module for the traction motor. In particular, the traction motor is an electric machine, for example of a hybrid vehicle or of a fully electric vehicle.

It should be mentioned at this point that the electronic module is not limited with respect to its use to drives, in particular electric drives, but rather it can also be used in numerous ways and also not only in the automotive industry.

In accordance with a preferred embodiment, the traction motor is an electric machine, wherein the first carrier element is connected in a positive-locking and/or non-positive locking manner to a field connection or phase connection of the electric machine. In an expedient manner, an insert-push contact is provided for the electrical connection of the field connection to the first carrier element. In accordance with one embodiment, the drive comprises also multiple electronic modules. In particular, the traction motor can be connected to multiple first carrier elements. In accordance with one embodiment, the electronic module is part of an integrated electric drive having a stator.

Further advantages and features are disclosed in the description below of an embodiment of an electronic module and its arrangement on a stator with reference to the attached figures.

DETAILED DESCRIPTION OF THE DRAWINGS

Figure 1:
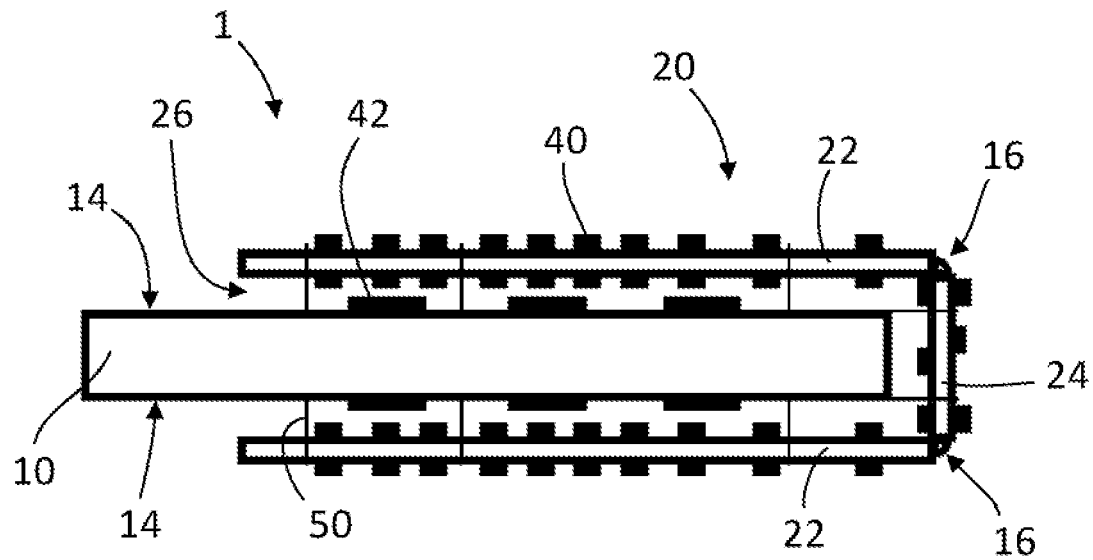
FIG. 1 illustrates a schematic view of an embodiment of an electronic module in accordance with the present invention.
Figure 2:
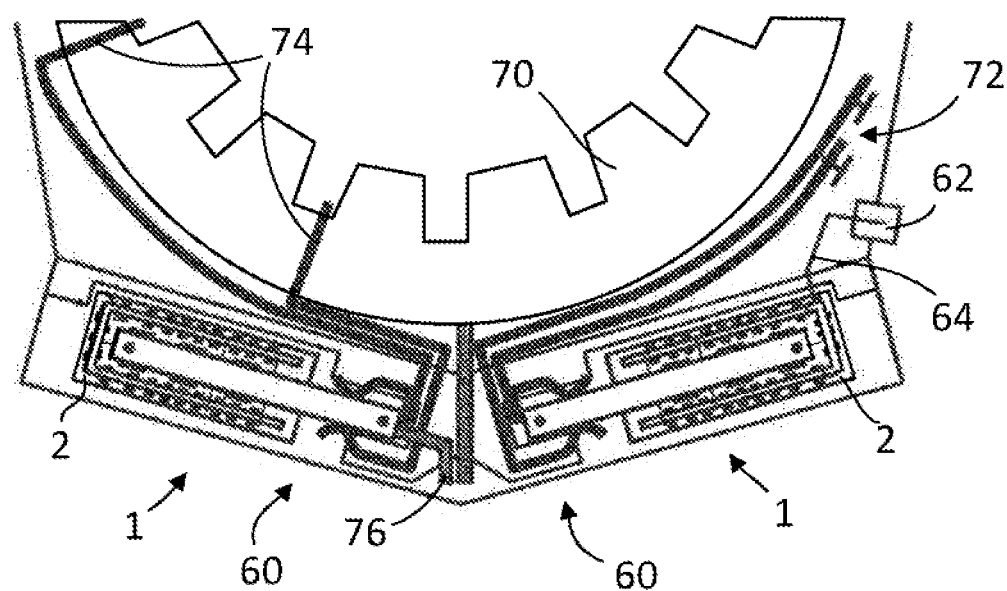
FIG. 2 illustrates a stator, comprising two embodiments of electronic modules for the controller in accordance with another embodiment of the present invention.

FIG. 1 illustrates a schematic view of an electronic module 1, comprising a first carrier element 10 and a second carrier element 20. The second carrier element 20 is arranged around the first carrier element 10. For this purpose, the second carrier element 20 comprises two main segments 22 that are arranged essentially parallel to one another, which are connected by way of a connecting segment 24 that is arranged so to speak on the end side with respect to the carrier element 10. The connecting segment 24 is connected to the respective main segments 22 by way of flexible regions 16. The first carrier element 10 is connected to the second carrier element 20 by means of schematically illustrated contact elements, in particular contact pins 50, wherein these are arranged both perpendicular with respect to the first carrier element 10 and also in parallel (for reasons of clarity only one is provided with a reference numeral). The entire surface area of the second carrier element 20 is advantageously "used". Components 40 are illustrated schematically as black areas and are arranged both on the first carrier element 10 and also on the second carrier element 20, in the present case in particular on both sides. In particular, (the) components 42 that are to be cooled are advantageously arranged on the first carrier element 10. It is preferred that the power electronic components that require to be cooled are therefore arranged there. The first carrier element 10 advantageously comprises a cooling facility which is however not illustrated in the figure. Only connections for a cooling medium are schematically illustrated in FIG. 2. The components 40 that are arranged on the second carrier element 20 are in particular logic and/or control components that do not require to be cooled. In the embodiment illustrated here, the second carrier element 20 is in particular U-shaped or forms such a U-shape. The first carrier element 10 is expediently arranged in the intermediate space or arrangement space 26 that is formed as a result of the U-shape, as a result of which a very compact construction is realized, which reduces the number of required plug connectors and the like to a minimum. The reference numeral 14 also indicates that conductor track contacts can be provided on the first carrier element 10 and these conductor track contacts serve to provide the electrical contact of the first carrier element 10, as also shown in particular in FIG. 2.

FIG. 2 illustrates a schematic view of at least one part of a drive, comprising an electric machine having a stator 70. The stator 70 comprises a field connection 72 and phase connections 74, wherein these are connected accordingly to two electronic modules 1, wherein for this purpose insert-push contacts 60 are provided. For purposes of cooling the electronic module 1, these advantageously comprise connections for a cooling medium 76. In particular, the right-hand electronic module 1 is still connected by way of a signal contact 64 to a control connection 62. Both electronic modules 1 comprise protective elements 2 that encase in particular the second carrier element, as also shown in FIG. 1. It is preferred that in this case the protective elements are a suitable casting mass.

LIST OF REFERENCE NUMERALS

1 Electronic module
2 Protective element
10 First carrier element
12 Intermediate space
14 Conductor track contacts
16 Flexible region
20 Second carrier element
22 Main segment
24 Connecting segment
26 Intermediate space, arrangement space
40 Component(s)
42 Components that are to be cooled
50 Contact pin
60 Insert-push contact
62 Control connection
64 Signal contact
70 Stator
72 Field connection
74 Phase connections
76 Connection for cooling medium

What is claimed is:

1. An electronic module, comprising:
a first carrier element;
a second carrier element; and
a plurality of components arranged on the first carrier element and on the second carrier element,
wherein
the first carrier element and the second carrier element are connected in an electrically conductive manner,
the second carrier element forms an intermediate space in which the first carrier element is arranged,
the second carrier element is at least in regions malleable or flexible, and
the second carrier element is formed such that the intermediate space is created when the malleable or flexible regions are bent.

2. The electronic module according to claim 1, wherein the second carrier element is U-shaped.

3. The electronic module according to claim 2, wherein the second carrier element includes two main segments spaced apart from one another in a parallel manner and a connecting segment connecting the main segments, and
the first carrier element is arranged between the main segments.

4. The electronic module according to claim 3, wherein at least one of the main segments and the connecting segment is electrically connected to the first carrier element.

5. The electronic module according to claim 4, wherein the first carrier element includes a cooling arrangement configured to cool ones of the plurality of components arranged on the first carrier element.

6. The electronic module according to claim 5, wherein the ones of the plurality of components arranged on the first carrier element include power electronic components, and
ones of the plurality of components arranged on the second carrier element include at least a logic component, at least one control component or at least one of a logic component and a control component.

7. The electronic module according to claim 4, wherein the first carrier element is configured to provide electrical contact with the second carrier element.

8. The electronic module according to claim 1, wherein the first carrier element includes a cooling arrangement configured to cool ones of the plurality of components arranged on the first carrier element.

9. The electronic module according to claim 1, wherein the ones of the plurality of components arranged on the first carrier element include power electronic components, and
ones of the plurality of components arranged on the second carrier element include at least a logic component, at least one control component or at least one of a logic component and a control component.

10. The electronic module according to claim 1, wherein the first carrier element is more rigid than the second carrier element.

11. The electronic module according to claim 1, further comprising:
a carrier structure configured to provide a mechanical connection between the first carrier element and the second carrier element.

12. The electronic module according to claim 11, wherein the carrier structure is fixedly connected to the first carrier element or to the second carrier element.

13. The electronic module according to claim 12, wherein the carrier structure includes at least one of a positive-locking arrangement, a non-positive locking arrangement or at least one positive-locking arrangement and at least one of a non-positive locking arrangement configured to connect the at least one of the first and second carrier elements.

14. The electronic module according to claim 11, wherein
the first carrier element includes a cooling arrangement configured to cool ones of the plurality of components arranged on the first carrier element,
the carrier structure is configured as a frame for an electrically insulating casting material over the ones of the plurality of components arranged on the first carrier element to be cooled.

15. A drive, comprising:
a traction motor; and
at least one electronic module configured to control the traction motor, the at least one electronic module including
a first carrier element;
a second carrier element; and
a plurality of components arranged on the first carrier element and on the second carrier element,
wherein
the first carrier element and the second carrier element are connected in an electrically conductive manner,
the second carrier element forms an intermediate space in which the first carrier element is arranged,
the second carrier element is at least in regions malleable or flexible, and
the second carrier element is formed such that the intermediate space is created when the malleable or flexible regions are bent.

16. The drive according to claim 15, wherein
the traction motor is an electric machine, and
the first carrier element is connected in a positive and non-positive locking manner to a field connection or phase connection of the electric machine.

* * * * *